(12) United States Patent
Lo et al.

(10) Patent No.: US 12,713,881 B2
(45) Date of Patent: Aug. 18, 2026

(54) PHOTORESIST HAVING STRENGTHENING MATERIAL

(71) Applicant: TAIWAN SEMICONDUCTOR MANUFACTURING COMPANY, LTD., Hsinchu (TW)

(72) Inventors: Yuan Chih Lo, Hsinchu City (TW); Shi-Cheng Wang, Tainan City (TW); Cheng-Han Wu, Taichung City (TW); Ching-Yu Chang, Yilang County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 845 days.

(21) Appl. No.: 17/882,840

(22) Filed: Aug. 8, 2022

(65) Prior Publication Data

US 2024/0047208 A1 Feb. 8, 2024

(51) Int. Cl.

| | |
|---|---|
| ***G03F 7/20*** | (2006.01) |
| ***G03F 7/16*** | (2006.01) |
| ***H10P 50/00*** | (2026.01) |
| ***H10P 76/20*** | (2026.01) |

(52) U.S. Cl.

CPC ............ *H10P 76/2041* (2026.01); *G03F 7/16* (2013.01); *G03F 7/2002* (2013.01); *H10P 50/71* (2026.01)

(58) Field of Classification Search

CPC ...... G03F 7/0042; G03F 7/0043; G03F 7/004; G03F 7/0044

See application file for complete search history.

(56) References Cited

U.S. PATENT DOCUMENTS

| | | | | |
|---|---|---|---|---|
| 5,366,852 | A * | 11/1994 | Pavelchek | G03F 7/36 430/326 |
| 8,764,995 | B2 | 7/2014 | Chang et al. | |
| 8,796,666 | B1 | 8/2014 | Huang et al. | |
| 8,828,625 | B2 | 9/2014 | Lu et al. | |
| 8,841,047 | B2 | 9/2014 | Yu et al. | |
| 8,877,409 | B2 | 11/2014 | Hsu et al. | |
| 9,093,530 | B2 | 7/2015 | Huang et al. | |
| 9,184,054 | B1 | 11/2015 | Huang et al. | |
| 9,256,123 | B2 | 2/2016 | Shih et al. | |
| 9,529,268 | B2 | 12/2016 | Chang et al. | |
| 9,548,303 | B2 | 1/2017 | Lee et al. | |
| 2021/0349390 | A1* | 11/2021 | de Schepper | G03F 7/2004 |
| 2023/0095970 | A1* | 3/2023 | Huang | C23C 16/042 430/5 |
| 2023/0326755 | A1* | 10/2023 | Lutker-Lee | H01L 21/31144 |

FOREIGN PATENT DOCUMENTS

| | | | | |
|---|---|---|---|---|
| JP | 2005-148597 | A * | 6/2005 | G03F 7/40 |

OTHER PUBLICATIONS

English Translation of Japanese Patent Publication No. 2005-148597 (Year: 2005).*

* cited by examiner

*Primary Examiner* — Daborah Chacko-Davis
(74) *Attorney, Agent, or Firm* — Maschoff Brennan

(57) ABSTRACT

A method of manufacturing a semiconductor device includes forming a photoresist layer over a substrate, exposing the photoresist layer to an EUV radiation, developing the photoresist layer to form a patterned photoresist, forming a coating layer on the patterned photoresist, and after forming the coating layer on the patterned photoresist, etching the substrate using a combination of the coating layer and the patterned photoresist as an etching mask.

20 Claims, 12 Drawing Sheets

205c

42
S102
48
46
44

42
S100
48
46
44

PHOTORESIST HAVING STRENGTHENING MATERIAL

BACKGROUND

As consumer devices have gotten smaller and smaller in response to consumer demand, the individual components of these devices have necessarily decreased in size as well. Semiconductor devices, which make up a major component of devices such as mobile phones, computer tablets, and the like, have been pressured to become smaller and smaller, with a corresponding pressure on the individual devices (e.g., transistors, resistors, capacitors, etc.) within the semiconductor devices to also be reduced in size.

One enabling technology that is used in the manufacturing processes of semiconductor devices is the use of photolithographic materials. Such materials are applied to a surface of a layer to be patterned and then exposed to an energy that has itself been patterned. Such an exposure modifies the chemical and physical properties of the exposed regions of the photosensitive material. This modification, along with the lack of modification in regions of the photosensitive material that were not exposed, can be exploited to remove one region without removing the other.

However, as the size of individual devices has decreased, process windows for photolithographic processing has become tighter and tighter. As such, advances in the field of photolithographic processing are necessary to maintain the ability to scale down the devices, and further improvements are needed in order to meet the desired design criteria such that the march towards smaller and smaller components may be maintained.

As the semiconductor industry has progressed into nanometer technology process nodes in pursuit of higher device density, higher performance, and lower costs, there have been challenges in reducing semiconductor feature size. Extreme ultraviolet lithography (EUVL) has been developed to form smaller semiconductor device feature size and increase device density on a semiconductor wafer. In order to improve EUVL, an increase in wafer exposure throughput is desirable.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term “made of” may mean either “comprising” or “consisting of.”

Figure 1A:
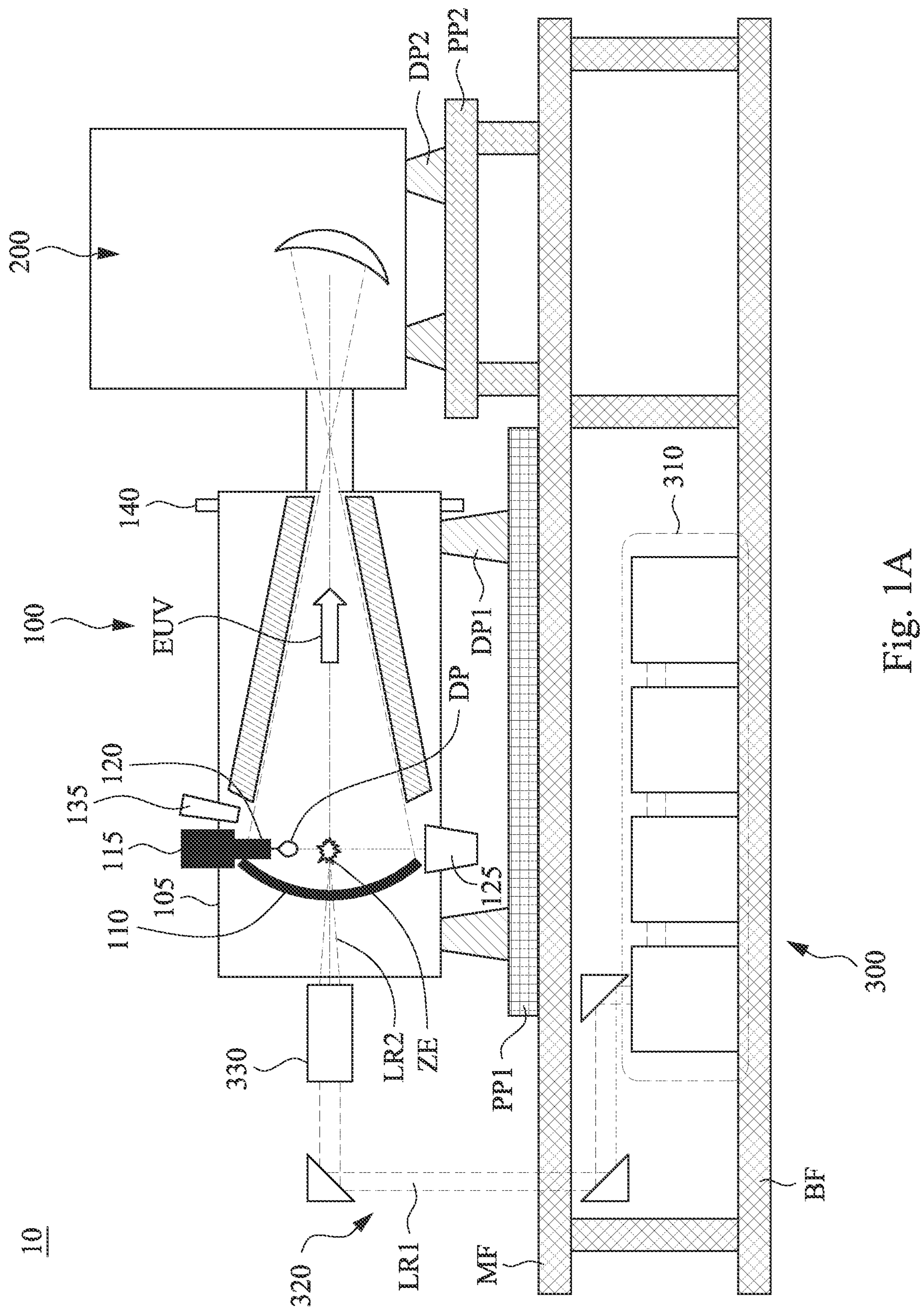
FIG. 1A is a schematic view of an extreme ultraviolet (EUV) lithography tool with an LPP-based EUV radiation source, in accordance with some embodiments of the present disclosure.

FIG. 1A is a schematic view diagram of an extreme ultraviolet (EUV) lithography system 10, constructed in accordance with some embodiments. The EUV lithography system 10 may also be generically referred to as a scanner that is configured to perform lithography exposure processes with respective radiation source and exposure mode. The EUV lithography system 10 is designed to expose a photoresist layer by EUV light or EUV radiation. The photoresist layer is a material sensitive to the EUV light. The EUV lithography system 10 employs a radiation source 100 to generate EUV light, such as EUV light having a wavelength ranging between about 1 nm and about 100 nm. In one particular example, the radiation source 100 generates a EUV light with a wavelength centered at about 13.5 nm. Accordingly, the radiation source 100 is also referred to as EUV radiation source 100.

EUV lithography is important to achieve delicate pattern with small pitch. The utilization of EUV can not only shrink the pattern size but also reduce the multiple repeating lithography-etch process, which is beneficial for throughput and cost. However, when the pitch becomes small, defect issue associated with the photoresist is more critical. Nowadays, the traditional chemically resist (CAR) faces several problems, for example, line collapse induced by poor mechanical strength of organic polymer and poor EUV sensitivity. Metal-oxide based photoresists are developed for their high mechanical strength and high sensitivity to EUV.

However, since the metal-oxide based photoresist is highly sensitive to EUV, the stochastic effect of electromagnetic wave and imperfect developer cause increased width roughness (LWR). Besides, to enhance the EUV move, the exposure dose should be as low as possible. However, when the exposure dose is reduced in the exposure process without improving EUV sensitivity of metal-oxide photoresist, the LWR may get worse, which is known as RLS trade-off. Moreover, as the critical dimension of the resist pattern of the photoresist becomes smaller, peeling may occur between the resist pattern and the underlying layer(s).

The present disclosure provides a photoresist including a material in which the material fills pores within the photoresist and covers an exterior surface thereof. The material can reduce surface roughness of the photoresist and reduce (or shrink) a critical dimension (CD) of the resist pattern, resulting in good line width roughness (LWR) and low exposure dose. Therefore, EUV move can be enhanced. Because the material can diffuse into the photoresist to fill the pores, the photoresist can thus have a strengthened rigidity, resulting in a broken-free and peeling-free nano-pattern formed by the photoresist. The various aspects of the present disclosure will be discussed below in greater detail with reference to FIGS. 1A-16. First, a EUV lithography system will be discussed below with reference to FIGS. 1A, 1B and 2. Next, the details of the photoresist including the material and the lithography process employing the photoresist including the material will be discussed with reference to FIGS. 3-16.

The advanced lithography process, method, and materials described in the current disclosure can be used in many applications, including fin-type field effect transistors (FinFETs), gate-all-around (GAA) FETs. For example, the fins may be patterned to produce a relatively close spacing between features, for which the above disclosure is well suited. In addition, spacers used in forming fins of FinFETs can be processed according to the above disclosure.

To address the trend of the Moore's law for decreasing size of chip components and the demand of higher computing power chips for mobile electronic devices such as smart phones with computer functions, multi-tasking capabilities, or even with workstation power. Smaller wavelength photolithography exposure systems are desirable. Extreme ultraviolet (EUV) photolithography technique uses an EUV radiation source to emit an EUV light ray with wavelength of about 13.5 nm. Because this wavelength is also in the x-ray radiation wavelength region, the EUV radiation source is also called a soft x-ray radiation source. The EUV light rays emitted from a laser-produced plasma (LPP) are collected by a collector mirror and reflected toward a patterned mask.

FIG. 1A is a schematic view of an EUV lithography tool with an LPP-based EUV radiation source, in accordance with some embodiments of the present disclosure. The EUV lithography system includes an EUV radiation source 100 to generate EUV radiation, an exposure device 200, such as a scanner, and an excitation laser source 300. As shown in FIG. 1A, in some embodiments, the EUV radiation source 100 and the exposure device 200 are installed on a main floor MF of a clean room, while the excitation laser source 300 is installed in a base floor BF located under the main floor MF. Each of the EUV radiation source 100 and the exposure device 200 are placed over pedestal plates PP1 and PP2 via dampers DP1 and DP2, respectively. The EUV radiation source 100 and the exposure device 200 are coupled to each other by a coupling mechanism, which may include a focusing unit.

The EUV lithography tool is designed to expose a resist layer to EUV light (also interchangeably referred to herein as EUV radiation). The resist layer is a material sensitive to the EUV light. The EUV lithography system employs the EUV radiation source 100 to generate EUV light, such as EUV light having a wavelength ranging between about 1 nm and about 100 nm. In one particular example, the EUV radiation source 100 generates an EUV light with a wavelength centered at about 13.5 nm. In the present embodiment, the EUV radiation source 100 utilizes a mechanism of laser-produced plasma (LPP) to generate the EUV radiation.

The exposure device 200 includes various reflective optic components, such as convex/concave/flat mirrors, a mask holding mechanism including a mask stage, and wafer holding mechanism. The EUV radiation EUV generated by the EUV radiation source 100 is guided by the reflective optical components onto a mask secured on the mask stage. In some embodiments, the mask stage includes an electrostatic chuck (e-chuck) to secure the mask.

Figure 1B:
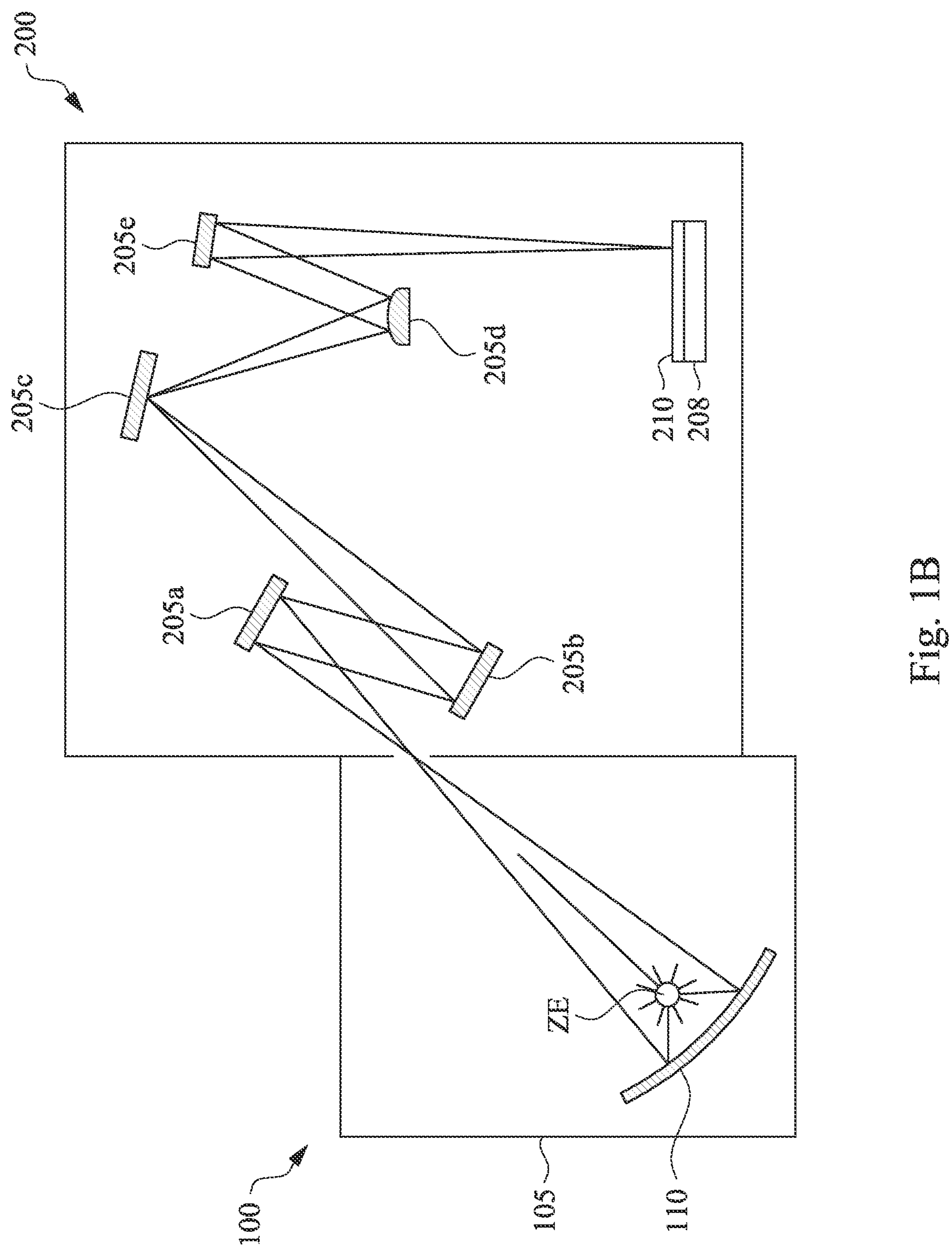
FIG. 1B is a simplified schematic diagram of a detail of an extreme ultraviolet lithography tool according to an embodiment of the disclosure showing the exposure of photoresist coated substrate with a patterned beam of EUV light.

FIG. 1B is a simplified schematic diagram of a detail of an extreme ultraviolet lithography tool according to an embodiment of the disclosure showing the exposure of photoresist coated substrate 210 secured on a substrate stage 208 of the exposure device 200 with a patterned beam of EUV light. The exposure device 200 is an integrated circuit lithography tool such as a stepper, scanner, step and scan system, direct write system, device using a contact and/or proximity mask, etc., provided with one or more optics 205*a*, 205*b*, for example, to illuminate a patterning optic 205*c*, such as a reticle, with a beam of EUV light, to produce a patterned beam, and one or more reduction projection optics 205*d*, 205*e*, for projecting the patterned beam onto the photoresist coated substrate 210. A mechanical assembly (not shown) may be provided for generating a controlled relative movement between the photoresist coated substrate 210 and the patterning optic 205*c*. As further shown in FIG. 2, the EUVL tool includes an EUV radiation source 100 including an EUV light radiator ZE emitting EUV light in a chamber 105 that is reflected by a collector 110 along a path into the exposure device 200 to irradiate the photoresist coated substrate 210.

As used herein, the term "optic" is meant to be broadly construed to include, and not necessarily be limited to, one or more components which reflect and/or transmit and/or operate on incident light, and includes, but is not limited to, one or more lenses, windows, filters, wedges, prisms, grisms, gradings, transmission fibers, etalons, diffusers, homogenizers, detectors and other instrument components, apertures, axicons and mirrors including multi-layer mirrors, near-normal incidence mirrors, grazing incidence mirrors, specular reflectors, diffuse reflectors and combinations thereof. Moreover, unless otherwise specified, the term "optic", as used herein, is directed to, but not limited to, components which operate solely or to advantage within one or more specific wavelength range(s) such as at the EUV output light wavelength, the irradiation laser wavelength, a wavelength suitable for metrology or any other specific wavelength.

In various embodiments of the present disclosure, the photoresist coated substrate 210 is a semiconductor wafer, such as a silicon wafer or other type of wafer to be patterned.

The EUVL tool further includes other modules or is integrated with (or coupled with) other modules in some embodiments.

As shown in FIG. 1A, the EUV radiation source 100 includes a target droplet generator 115 and a collector 110, enclosed by a chamber 105. For example, the collector 110 is a laser-produced plasma (LPP) collector. In various embodiments, the target droplet generator 115 includes a reservoir to hold a source material and a nozzle 120 through which target droplets DP of the source material are supplied into the chamber 105.

In some embodiments, the target droplets DP are metal droplets of tin (Sn), lithium (Li), or an alloy of Sn and Li. In some embodiments, the target droplets DP each have a diameter in a range from about 10 microns (μm) to about 100 μm. For example, in an embodiment, the target droplets DP are tin droplets, having a diameter of about 10 μm to about 100 μm. In other embodiments, the target droplets DP are tin droplets having a diameter of about 25 μm to about 50 μm. In some embodiments, the target droplets DP are supplied through the nozzle 120 at a rate in a range from about 50 droplets per second (i.e., an ejection-frequency of about 50 Hz) to about 50,000 droplets per second (i.e., an ejection-frequency of about 50 kHz).

Referring back to FIG. 1A, an excitation laser LR2 generated by the excitation laser source 300 is a pulse laser. The laser pulses LR2 are generated by the excitation laser source 300. The excitation laser source 300 may include a laser generator 310, laser guide optics 320 and a focusing apparatus 330. In some embodiments, the laser generator 310 includes a carbon dioxide ($CO_2$) or a neodymium-doped yttrium aluminum garnet (Nd:YAG) laser source with a wavelength in the infrared region of the electromagnetic spectrum. For example, the laser generator 310 has a wavelength of about 9.4 μm or about 10.6 μm, in an embodiment. The laser light LR1 generated by the laser generator 310 is guided by the laser guide optics 320 and focused into the excitation laser LR2 by the focusing apparatus 330, and then introduced into the EUV radiation source 100.

In some embodiments, the excitation laser LR2 includes a pre-heat laser and a main laser. In such embodiments, the pre-heat laser pulse (interchangeably referred to herein as the "pre-pulse") is used to heat (or pre-heat) a given target droplet to create a low-density target plume with multiple smaller droplets, which is subsequently heated (or reheated) by a pulse from the main laser, generating increased emission of EUV light.

In various embodiments, the pre-heat laser pulses have a spot size about 100 μm or less, and the main laser pulses have a spot size in a range of about 150 μm to about 300 μm. In some embodiments, the pre-heat laser and the main laser pulses have a pulse-duration in the range from about 10 ns to about 50 ns, and a pulse-frequency in the range from about 1 kHz to about 100 kHz. In various embodiments, the pre-heat laser and the main laser have an average power in the range from about 1 kilowatt (kW) to about 50 kW. The pulse-frequency of the excitation laser LR2 is matched with (e.g., synchronized with) the ejection-frequency of the target droplets DP in an embodiment.

The excitation laser LR2 is directed through windows (or lenses) into the zone of excitation ZE in front of the collector 110. The windows are made of a suitable material substantially transparent to the laser beams. The generation of the pulse lasers is synchronized with the ejection of the target droplets DP through the nozzle 120. As the target droplets move through the excitation zone, the pre-pulses heat the target droplets and transform them into low-density target plumes. A delay between the pre-pulse and the main pulse is controlled to allow the target plume to form and to expand to an optimal size and geometry. In various embodiments, the pre-pulse and the main pulse have the same pulse-duration and peak power. When the main pulse heats the target plume, a high-temperature plasma is generated. The plasma emits EUV radiation EUV, which is collected by the collector 110. The collector 110 further reflects and focuses the EUV radiation for the lithography exposing processes performed through the exposure device 200. The droplet catcher 125 is used for catching excessive target droplets. For example, some target droplets may be purposely missed by the laser pulses.

In some embodiments, the collector 110 is designed with a proper coating material and shape to function as a mirror for EUV collection, reflection, and focusing. In some embodiments, the collector 110 is designed to have an ellipsoidal geometry. In some embodiments, the coating material of the collector 110 is similar to the reflective multilayer of the EUV mask. In some examples, the coating material of the collector 110 includes a ML (such as a plurality of Mo/Si film pairs) and may further include a capping layer (such as Ru) coated on the ML to substantially reflect the EUV light. In some embodiments, the collector 110 may further include a grating structure designed to effectively scatter the laser beam directed onto the collector 110. For example, a silicon nitride layer is coated on the collector 110 and is patterned to have a grating pattern.

In the present disclosure, the terms mask, photomask, and reticle are used interchangeably. In the present embodiment, the patterning optic 205*c* is a reflective mask 205*c*. The reflective mask 205*c* also includes a reflective ML deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light.

The mask 205*c* may further include a capping layer, such as ruthenium (Ru), disposed on the ML for protection. The mask 205*c* further includes an absorption layer deposited over the ML. The absorption layer is patterned to define a layer of an integrated circuit (IC), the absorber layer is discussed below in greater detail according to various aspects of the present disclosure. Alternatively, another reflective layer may be deposited over the ML and is patterned to define a layer of an integrated circuit, thereby forming a EUV phase shift mask.

The mask 205*c* and the method making the same are further described in accordance with some embodiments. In some embodiments, the mask fabrication process includes two operations: a blank mask fabrication process and a mask patterning process. During the blank mask fabrication process, a blank mask is formed by deposing suitable layers (e.g., reflective multiple layers) on a suitable substrate. The blank mask is then patterned during the mask patterning process to achieve a desired design of a layer of an integrated circuit (IC). The patterned mask is then used to transfer circuit patterns (e.g., the design of a layer of an IC) onto a semiconductor wafer. The patterns can be transferred over and over onto multiple wafers through various lithography processes. A set of masks is used to construct a complete IC.

Figure 2:
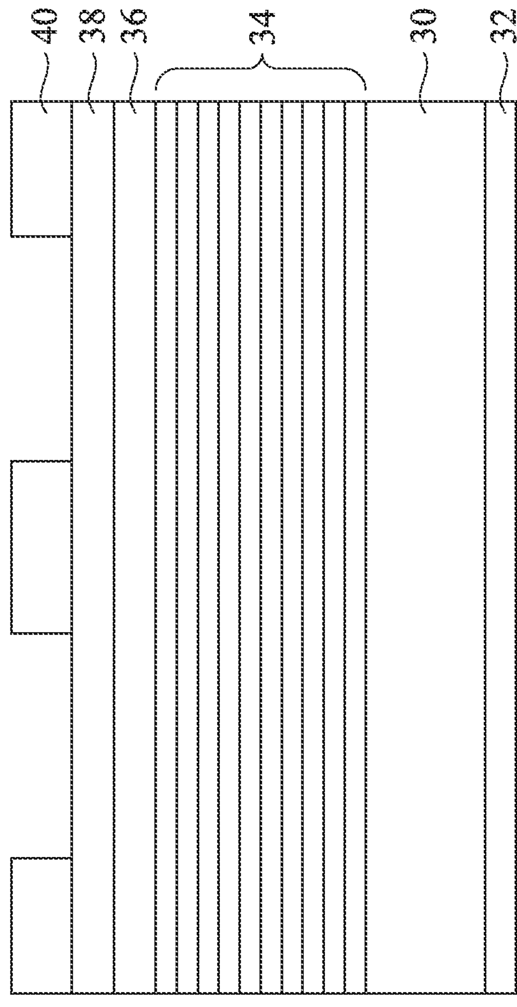
FIG. 2 is a sectional view of a EUV mask constructed in accordance with some embodiments of the present disclosure.

One example of the reflective mask 205*c* is shown in FIG. 2. The reflective mask 205*c* in the illustrated embodiment is a EUV mask, and includes a substrate 30 made of a LTEM. The LTEM material may include $TiO_2$ doped $SiO_2$, and/or other low thermal expansion materials known in the art. In some embodiments, a conductive layer 32 is additionally disposed under on the backside of the LTEM substrate 30 for the electrostatic chucking purpose. In one example, the conductive layer 32 includes chromium nitride (CrN), though other suitable compositions are possible.

The reflective mask 205*c* includes a reflective multilayer (ML) structure 34 disposed over the LTEM substrate 30. The ML structure 34 may be selected such that it provides a high reflectivity to a selected radiation type/wavelength. The ML structure 34 includes a plurality of film pairs, such as Mo/Si film pairs (e.g., a layer of molybdenum above or below a layer of silicon in each film pair). Alternatively, the ML structure 34 may include Mo/Be film pairs, or any materials with refractive index difference being highly reflective at EUV wavelengths.

Still referring to FIG. 2, the EUV mask 205*c* also includes a capping layer 36 disposed over the ML structure 34 to prevent oxidation of the ML. The EUV mask 205*c* may further include a buffer layer 38 disposed above the capping layer 36 to serve as an etching-stop layer in a patterning or repairing process of an absorption layer, which will be described later. The buffer layer 38 has different etching characteristics from the absorption layer disposed thereabove. The buffer layer 38 includes ruthenium (Ru), Ru compounds such as RuB, RuSi, chromium (Cr), chromium oxide, and chromium nitride in various examples.

The EUV mask 205*c* also includes an absorber layer 40 (also referred to as an absorption layer) formed over the buffer layer 38. In some embodiments, the absorber layer 40 absorbs the EUV radiation directed onto the mask. In various embodiments, the absorber layer may be made of tantalum boron nitride (TaBN), tantalum boron oxide (TaBO), or chromium (Cr), Radium (Ra), or a suitable oxide or nitride (or alloy) of one or more of the following materials: Actium, Radium, Tellurium, Zinc, Copper, and Aluminum.

FIGS. 3-16 are diagrammatic fragmentary cross-sectional side views of a semiconductor device 42 at various stages of fabrication in accordance with various aspects of the present disclosure. In some embodiments, the semiconductor device 42 may include an integrated circuit (IC) chip, system on chip (SoC), or portion thereof, and may include various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, or other types of transistor.

Figures 3, 4:
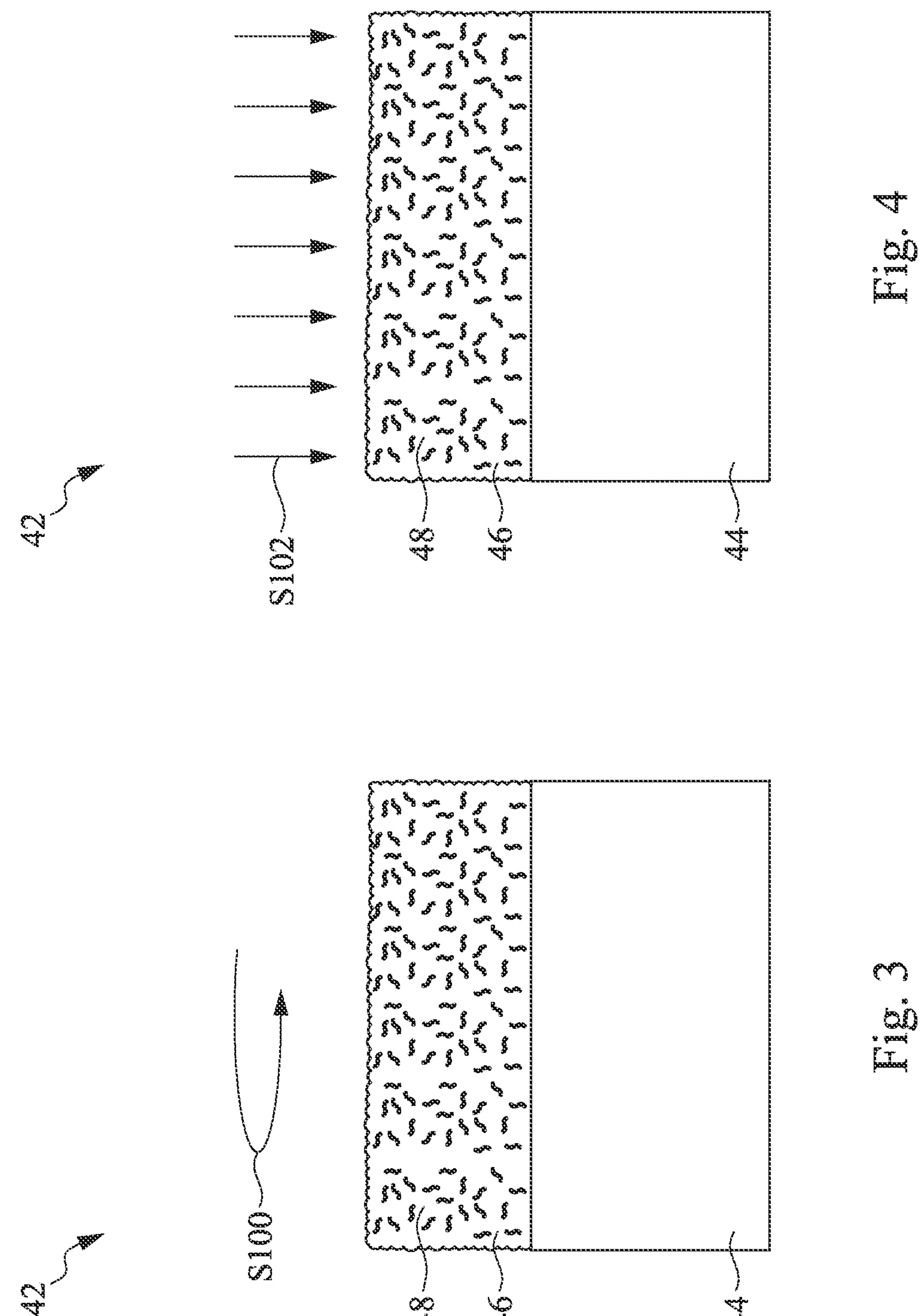
FIGS. 3-11 are diagrammatic fragmentary cross-sectional side views of a semiconductor device at various stages of fabrication in accordance with various aspects of the present disclosure.

Reference is made to FIG. 3. A photoresist layer 46 is coated on a surface of a layer to be patterned (or target layer) or a substrate in an operation S100. For example, the semiconductor device 42 includes a substrate 44 is illustrated. In some embodiments, the substrate 44 is a silicon substrate doped with a p-type dopant such as boron (for example a p-type substrate). Alternatively, the substrate 44 could be another suitable semiconductor material. For example, the substrate 44 may be a silicon substrate that is doped with an n-type dopant such as phosphorous or arsenic (an n-type substrate). The substrate 44 could include other elementary semiconductors such as germanium and diamond. The substrate 44 could optionally include a compound semiconductor and/or an alloy semiconductor. Further, the substrate 44 could include an epitaxial layer (epi layer), may be strained for performance enhancement, and may include a silicon-on-insulator (SOI) structure.

In some embodiments, the substrate 44 is substantially conductive or semi-conductive. The electrical resistance may be less than about $10^3$ ohm-meter. In some embodiments, the substrate 44 contains metal, metal alloy, or metal nitride/sulfide/selenide/oxide/silicide with the formula MXa, where M is a metal, and X is N, S, Se, O, Si, and where "a" is in a range from about 0.4 to 2.5. For example, the substrate 44 may contain Ti, Al, Co, Ru, TiN, $WN_2$, or TaN.

In some other embodiments, the substrate 44 contains a dielectric material with a dielectric constant in a range from about 1 to about 40. In some other embodiments, the substrate 44 contains Si, metal oxide, or metal nitride, where the formula is $MX_b$, wherein M is a metal or Si, and X is N or O, and wherein "b" is in a range from about 0.4 to 2.5. For example, the substrate 44 may contain $SiO_2$, silicon nitride, aluminum oxide, hafnium oxide, or lanthanum oxide.

The photoresist layer 46 may be formed by a spin-coating process. The photoresist layer 46 has a composition including a solvent and a metal-containing component dissolved in the solvent. In some embodiments, the metal-containing component is an organometallic compound or precursor, such as transition metal complexes characterized with coordination numbers that range from 1 to 12. When exposed to actinic radiation, the photoresist layer 46 undergoes one or more chemical reactions causing a change in solubility in a developer composition. In some embodiments, the photoresist layer 46 includes a metal-oxide containing component made of metal oxide of Sn, Hf, Zn, Ti or a combination thereof. In some embodiments, the photoresist layer 46 is a porous structure having pores 48 formed therein.

Referring to FIG. 4, a soft baking (SB) process S102 may be further applied to the photoresist layer 46 after the operation S100 to reduce the solvent in the photoresist layer 46. For example, the solvent may be partially evaporated by the soft baking process.

Figure 5:
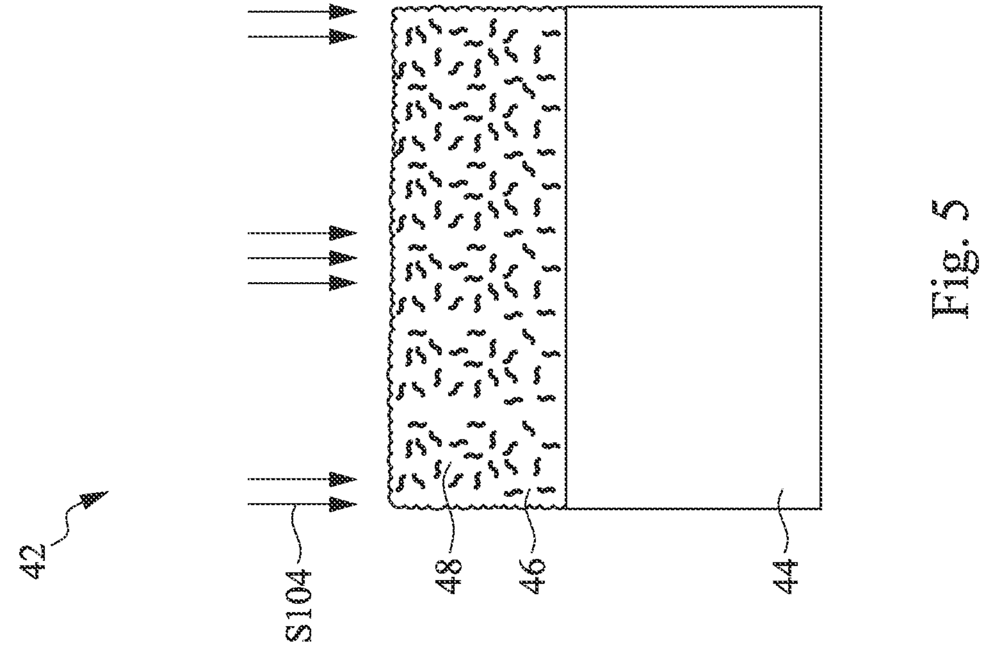
Figures 6, 7:
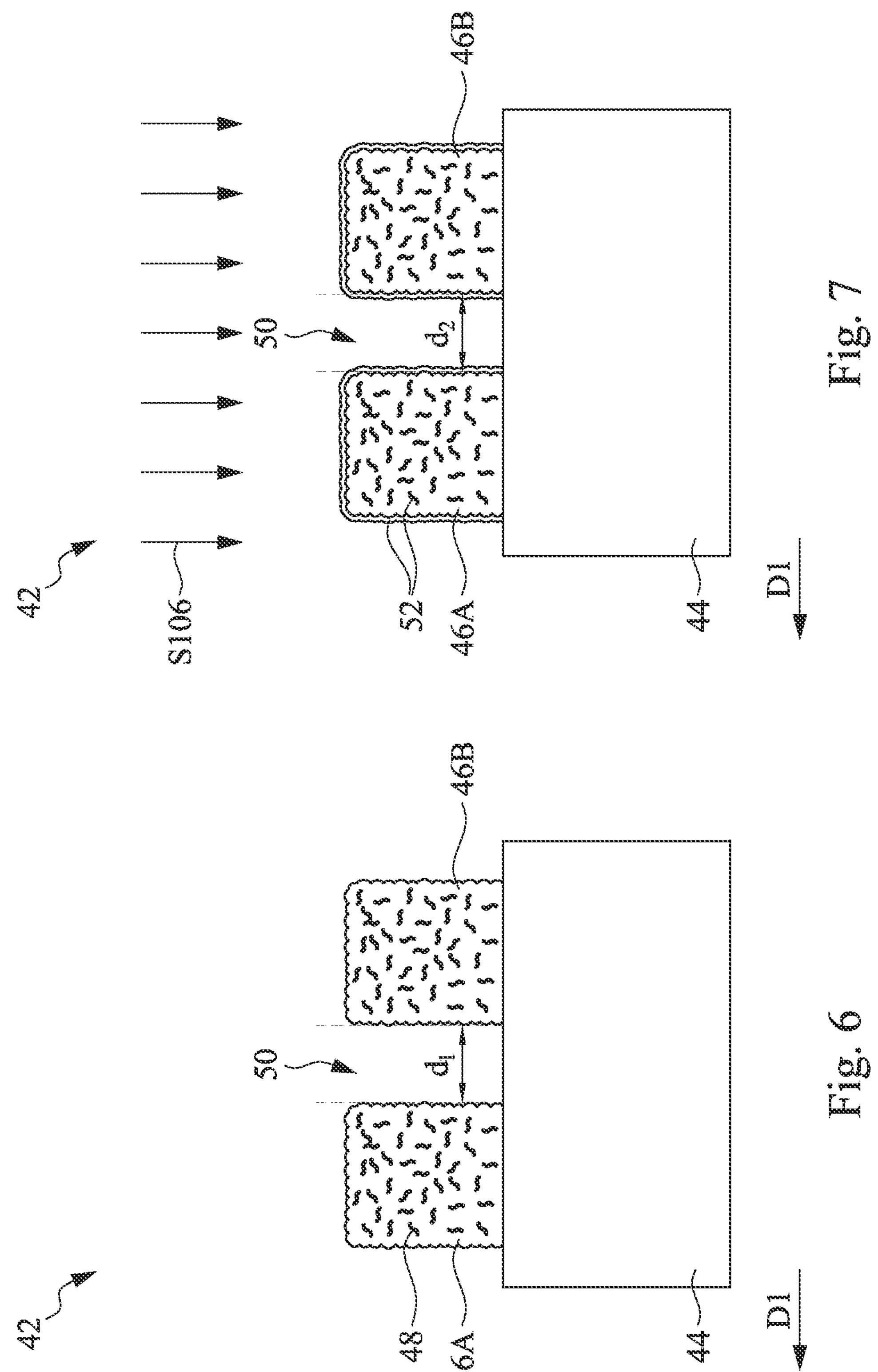

Referring to FIG. 5, an exposure process S104 is performed to expose a portion of the photoresist layer 46 to an EUV radiation. The exposure process S104 applies the EUV radiation to an area of the photoresist layer 46. In some embodiments, after the photoresist layer 46 is exposed, a post exposure baking (PEB) process may be applied to the exposed photoresist layer 46 to intensify a chemical reaction during the exposure process S104 and prevent the metal-oxide containing component of the photoresist layer 46 from aggregating and becoming insoluble to a developer during a subsequent developing process. In FIG. 6, the exposed photoresist layer 46 is then developed, forming a patterned photoresist, which for the sake of simplicity is illustrated herein as photoresist segments 46A and 46B separated by a trench 50. In some embodiments, the photoresist segments 46A and 46B are separated by a distance $d_1$ along a first direction D1. After developing the exposed photoresist layer 46, an optional hard bake may be performed, in which the hard bake serves to improve the insolubility of the photoresist segments 46A and 46B.

Referring to FIG. 7, a photoresist-strengthening material 52 is applied to the photoresist segments 46A and 46B to fill the pores 48 (see FIG. 6) and cover exterior surfaces of the photoresist segments 46A and 46B by an operation S106. Therefore, the photoresist-strengthening material 52 can be referred to as a photoresist-strengthening coating layer 52 or a photoresist-strengthening fill material 52. The photoresist segments 46A and 46B and the corresponding photoresist-strengthening material 52 are collectively referred to as a patterned mask. The photoresist-strengthening material 52 extends along opposite sidewalls of each of the photoresist segments 46A and 46B. In some cases, the photoresist-strengthening material 52 surrounds the exterior surfaces of the photoresist segments 46A and 46B. The photoresist-strengthening material 52 is configured to strengthen the photoresist rigidity reduce surface roughness of the photoresist segments 46A and 46B and reduce (or shrink) a critical dimension (CD) of the trench 50, resulting in good line width roughness (LWR) and low exposure dose. Therefore, EUV yield can be enhanced. The photoresist-strengthening material 52 has smaller molecules than pores 48 of the photoresist 46, and therefore during applying the photoresist-strengthening material 52, the photoresist-strengthening material 52 can diffuse into the photoresist segments 46A and 46B to fill the pores 48 (see FIG. 6) and thus strengthen a rigidity of the photoresist segments 46A and 46B, resulting in broken-free and peeling-free nano-pattern formed by the photoresist segments 46A and 46B.

In one example, due to the photoresist-strengthening material 52, the trench 50 between the photoresist segments 46A and 46B is narrowed in the direction D1. In other words, the photoresist segments 46A and 46B are separated by a distance $d_2$ along the direction D1 smaller than the distance $d_1$ in the direction D1. In some embodiments, the photoresist-strengthening material 52 is a single layer or a multilayer.

The operation S106 includes solution-coating method, sol-gel process, chemical vapor deposition (CVD), physical vapor deposition (PVD), atomic layer deposition (ALD), the like, or a combination thereof. In some embodiments, the photoresist-strengthening material 52 can be in a gaseous state at room temperature. In some embodiments, the photoresist-strengthening material 52 can be in a gaseous state at an elevated temperature higher than room temperature, under a normal pressure (i.e., 1 atm) or reduced pressure (i.e., a pressure lower than 1 atm). In some embodiments, the photoresist-strengthening material 52 is made of a solution prepared by dissolving a chemical compound in a solvent including an organic solvent or water.

In some embodiments, the photoresist-strengthening material 52 includes one or more phosphoric acid groups, one or more phosphonate groups, or a combination thereof. For example, the phosphoric acid group has a formula of $R—PO_3H_2$, and the phosphonate group has a formula of $R—PO_3R'_2$, where R and R' may be a branched or unbranched, cyclic alkyl, alkene or alkyne substituted with a hydroxyl group, an amine group, epoxy group, a carboxylic amide group, an ester group, an acid group, a sulfate group, an ether group, or a halogen group, an aromatic ring, or an organometallic complex.

In some embodiments, the photoresist-strengthening material 52 includes a silane having a formula of $R_aSiX_b$, a sum of a and b is equal to 4, R is a branched or unbranched, cyclic alkyl, alkene or alkyne substituted with a hydroxyl group, an amine group, an epoxy group, a carboxylic group, an amide group, an ester group, an acid group, a sulfate group, an ether group, or a halogen group, an aromatic ring, or an organometallic complex, and X is a halogen, an alkoxy group or a fluoroalkoxy group. In one example where the photoresist-strengthening material 52 includes a silane having the formula of $R_aSiX_b$, a degree of intermolecular crosslinking thereof can be adjusted by X and a number of X (i.e., b).

In some embodiments, the photoresist-strengthening material 52 includes a metal oxide including $R_aSn_bO_cR'_dX_e$, $R_aTi_bO_cR'_dX_e$, $R_aZr_bO_cR'_dX_e$, $R_aHf_bO_cR'_dX_e$, $R_aZn_bO_cR'_dX_e$, $R_aAl_bO_cR'_dX_e$ or $R_aCu_bO_cR'_dX_e$, R is a mono-dentate organic ligand or a multi-dentate organic ligand consisting of a branched, unbranched, or cyclic alkyl, alkene, alkyne, ketone, amide, carboxylic acid, aromatic ring, or a derivative thereof, substituted with a halogen group, R' is an organic ligand consisting of a branched, unbranched, or cyclic alkyl, alkene, alkyne, ketone, amide, carboxylic acid, aromatic ring, or a derivative thereof, substituted with a halogen group or an H atom, X is a counter ion being a halide or a carboxylic anion, and a sum of a, c, d and e equals to a multiplied value obtained by multiplying b and an oxidation number of a metal (e.g., Sn, Ti, Zr, Hf, Zn, Al, and Cu) of the metal oxide. In some cases where the photoresist-strengthening material 52 includes the metal oxide, the photoresist-strengthening material 52 can be made of a solution prepared by dissolving a chemical compound (e.g., the metal oxide clusters) in a solvent including an organic solvent or water or a monomer of the monomer type selected from the group including $R_aSn_bO_cR'_dX_e$, $R_aTi_bO_cR'_dX_e$, $R_aZr_bO_cR'_dX_e$, $R_aHf_bO_cR'_dX_e$, $R_aZn_bO_cR'_dX_e$, $R_aAl_bO_cR'_dX_e$ and $R_aCu_bO_cR'_dX_e$.

In some embodiments, the photoresist-strengthening material 52 is an organometallic compound including $R_aSn_bX_c$, $R_aTi_bX_c$, $R_aZr_bX_c$, $R_aHf_bX_c$, $R_aZn_bX_c$, $R_aAl_bX_c$ or $R_aCu_bX_c$, R is a mono-dentate organic ligand or a multi-dentate organic ligand consisting of a branched, unbranched, or cyclic alkyl, alkene, alkyne, ketone, amide, carboxylic acid, aromatic ring, or a derivative thereof, substituted with a halogen group, X is an organic ligand consisting of branched, unbranched, or cyclic alkyl, alkene, alkyne, ketone, amide, carboxylic acid, aromatic ring, or a derivative thereof, substituted with a halogen group, an $NR'_2$, a halide, an SW, an OR', R' consists of a branched, unbranched, or cyclic alkyl, alkene, alkyne, ketone, amide, carboxylic acid, aromatic ring, or a derivative thereof, substituted with a halogen group or an H atom, and a sum of a and c is equal to a multiplied value obtained by multiplying b and an oxidation number of a metal of the organometallic compound. In some cases where the photoresist-strengthening material 52 includes the organometallic compound, such as $R_aSn_bX_c$, $R_aTi_bX_c$, $R_aZr_bX_c$, $R_aHf_bX_c$, $R_aZn_bX_c$, $R_aAl_bX_c$ or $R_aCu_bX_c$, the photoresist-strengthening material 52 52 can be made of a solution prepared by dissolving a chemical compound (i.e., the organometallic compound) in a solvent including an organic solvent or water, and the photoresist-strengthening material 52 can be in a gaseous state or a liquid state.

In some embodiments, the photoresist-strengthening material 52 can include organic molecules consisting of a branched, unbranched, or cyclic alkyl, alkene, alkyne, ketone, amide, carboxylic acid, aromatic ring, or a derivative thereof, substituted with a halogen group, and comprises a group including mono- or multi-hydroxyls, ketones, amides, carboxylic acids, isocyanates, epoxies, aromatic rings, or a derivative thereof, substituted with a halogen group or an H atom.

Figures 8, 9:
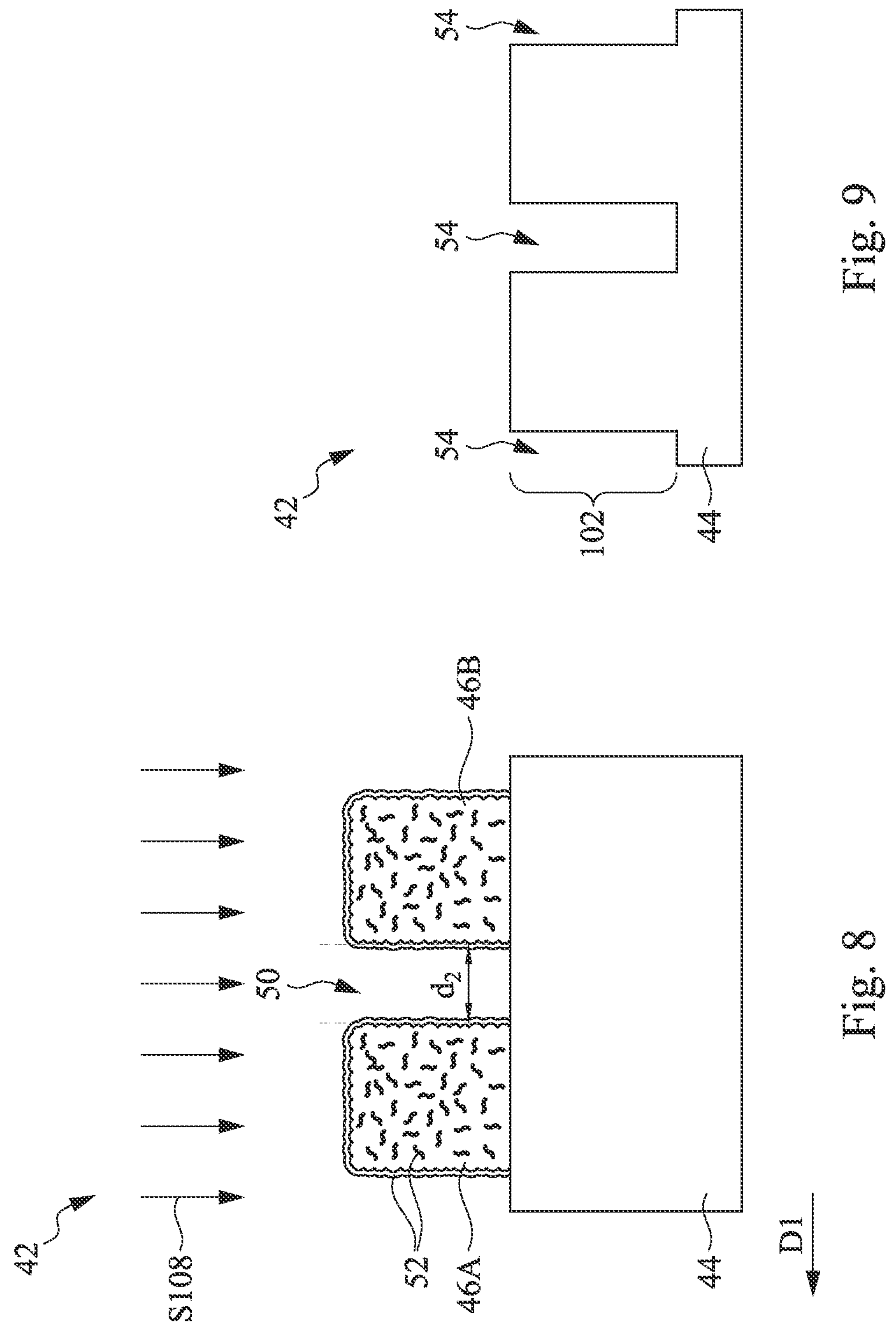

In various alternative embodiments, an optional work up treatment S108 is performed to the combination of photoresist-strengthening material 52 and the patterned photoresist 46, as shown in FIG. 8. The work up treatment S108 may surface to harden the photoresist-strengthening material 52, and may include, for example, an extreme ultra violet (EUV) exposure, a deep ultraviolet (DUV) exposure, an ultraviolet (UV) exposure, a visible light exposure, baking, or a liquid treatment, such as a solution treatment or a solvent treatment. In some embodiments, the work up treatment S108 may be referred to as a hardening treatment. Depending on a concentration or a nature of the photoresist-strengthening material 52, or a precursor used to apply the photoresist-strengthening material 52, process parameters (e.g., a process time, a temperature, a chemical flow rate, and a number of loop to apply the photoresist-strengthening material 52), the work up treatment S108 can be performed during or after applying the photoresist-strengthening material 52 (e.g., the operation S106).

Using a combination of the patterned photoresist layer 46 (e.g., the photoresist segments 46A and 46B) and the photoresist-strengthening material 52 as a mask, addition fabrication processes such as etching or implantation may be performed. For example, referring to FIG. 9, the pattern of the photoresist segments 46A and 46B are extended into the substrate 44 to create trenches 54 in the substrate 44 by etching, using one or more suitable etchants. Therefore, semiconductor strips 102 are formed. The photoresist segments 46A and 46B are at least partially removed during the etching operation in some embodiments. In other embodiments, the photoresist segments 46A and 46B are removed after etching the substrate 44 by using a suitable photoresist stripper solvent or by a photoresist ashing operation.

Isolation regions such as shallow trench isolation (STI) regions 56 may be formed on the substrate 44, filling into the trenches 54. The resulting structure in shown in FIG. 10.

The STI regions 56 may include a liner oxide (not shown). The liner oxide may be formed of a thermal oxide formed through a thermal oxidation of a surface layer of the substrate 44. The liner oxide may also be a deposited silicon oxide layer formed using, for example, Atomic Layer Deposition (ALD), High-Density Plasma Chemical Vapor Deposition (HDPCVD), or Chemical Vapor Deposition (CVD). The STI regions 56 may also include a dielectric material over the liner oxide, and the dielectric material may be formed using flowable chemical vapor deposition (FCVD), spin-on coating, or the like.

Figure 11:
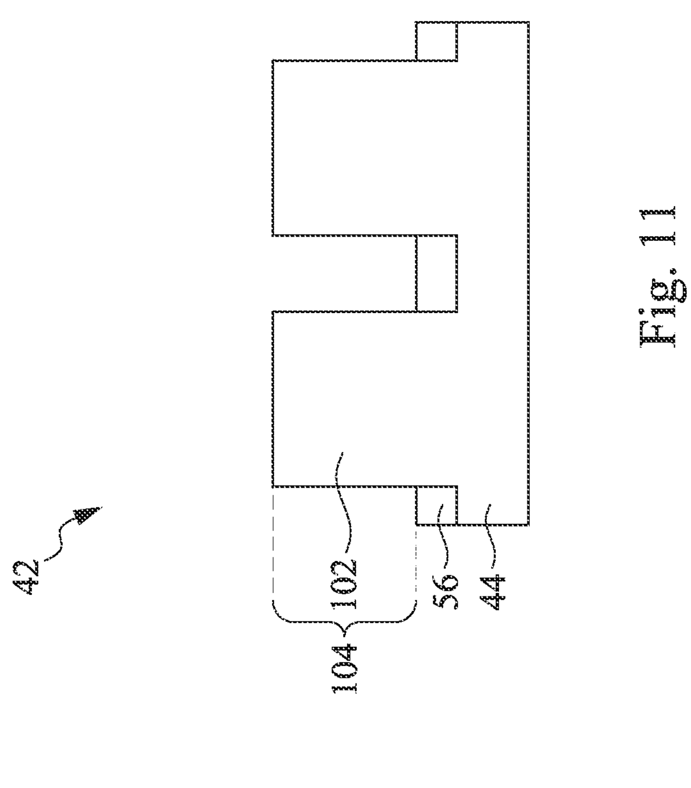
Figure 10:
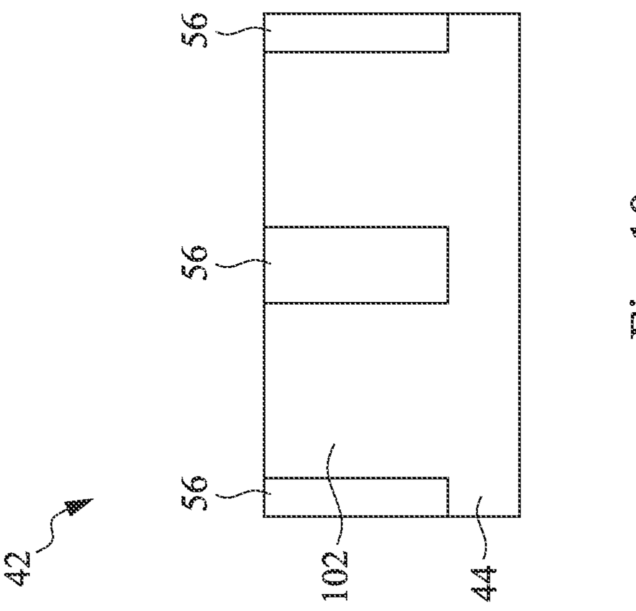

Referring to FIG. 11, the STI regions 56 are recessed, so that the top portions of semiconductor strips 102 protrude higher than top surfaces of the neighboring STI regions 56 to form protruding fins 104. The etching may be performed using a dry etching process or a wet etching process.

Figure 12A:
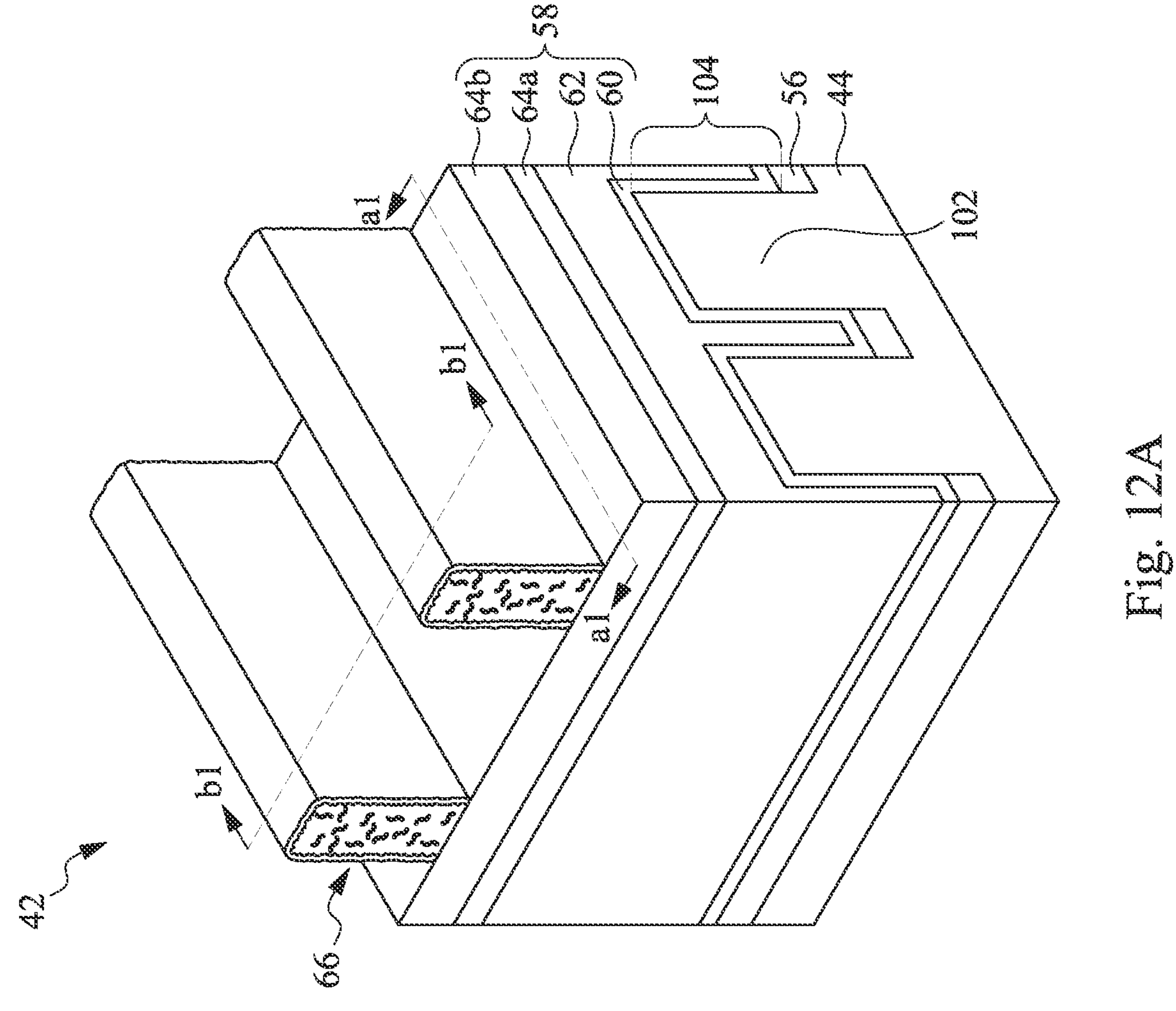
FIG. 12A is a perspective view of a semiconductor device at various stages of fabrication in accordance with various aspects of the present disclosure.
Figure 12C:
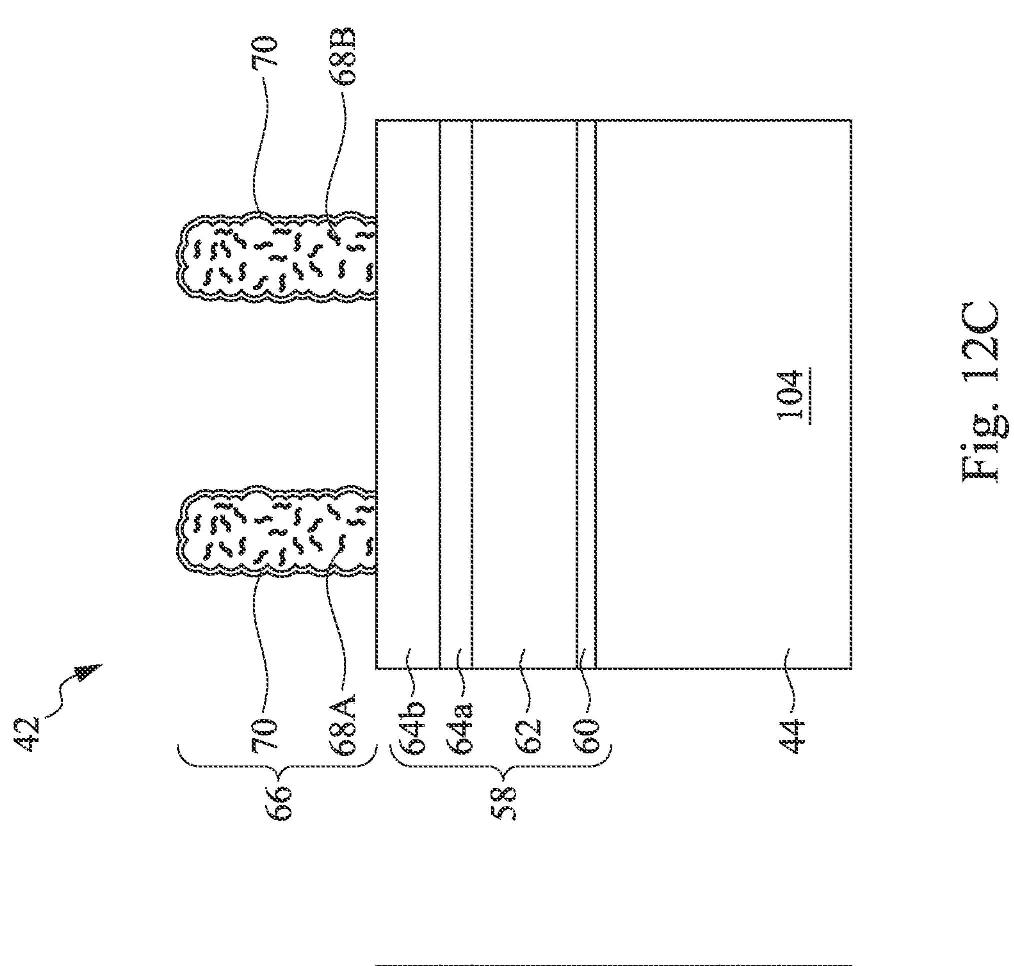
FIG. 12C is a cross-sectional view of a semiconductor device taken along a line b1-b1 of FIG. 12A.
Figure 12B:
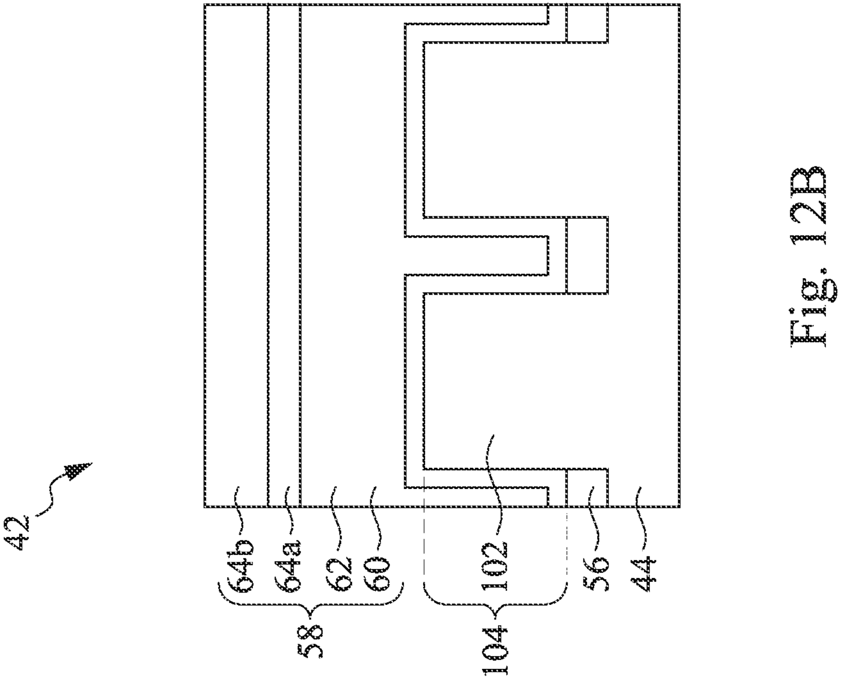
FIG. 12B is a cross-sectional view of a semiconductor device taken along a line a1-a1 of FIG. 12A.

FIG. 12A is a perspective view of the semiconductor device 42 at various stages of fabrication in accordance with various aspects of the present disclosure. FIG. 12B is a cross-sectional view of the semiconductor device 42 taken along a line a1-a1 of FIG. 12A. FIG. 12C is a cross-sectional view of the semiconductor device 42 taken along a line b1-b1 of FIG. 12A. FIGS. 13-16 are diagrammatic fragmentary cross-sectional side views of the semiconductor device 42 at various stages of fabrication in accordance with various aspects of the present disclosure. Referring to FIGS. 12A-12C, a dummy gate stack 58 is formed on top surfaces and sidewalls of the protruding fins 104. The dummy gate stack 58 may include a dummy gate dielectric 60 and a dummy gate electrode 62 over the dummy gate dielectric 60. The dummy gate dielectric 60 may be, for example, silicon oxide, silicon nitride, a combination thereof, or the like, and may be deposited or thermally grown according to acceptable techniques. The dummy gate electrode 62 may be deposited over the dummy gate dielectric 60 and then planarized, such as by a CMP. The dummy gate electrode 62 may be deposited by PVD, CVD, sputter deposition, or other techniques for depositing the selected material.

The dummy gate dielectric 60 may further include an interfacial layer (not shown) including silicon oxide. The dummy gate electrode 62 may be formed, for example, using polysilicon, and other materials may also be used. The dummy gate electrode 62 may be made of other materials that have a high etching selectivity from the etching of STI regions 56. The dummy gate stack 58 may also include hard mask layers 64*a* and 64*b* over the dummy gate electrode 62. The hard mask layers 64*a* and 64*b* may be formed of silicon nitride and silicon oxide, respectively. The dummy gate stack 58 may cross over a single one or a plurality of protruding fins 104 and/or STI regions 56. The dummy gate stack 58 also has a lengthwise direction perpendicular to the lengthwise directions of protruding fins 104.

A patterned mask 66 is formed on the dummy gate stack 58. The patterned mask 66 includes photoresist segments 68A and 68B and corresponding photoresist-strengthening material 70. The above discussion of the photoresist segments 46A and 46B applies to the photoresist segments 68A and 68B, unless mentioned otherwise. The above discussion of the photoresist-strengthening material 52 applies to the photoresist-strengthening material 70, unless mentioned otherwise. Therefore, the patterned mask 66 has a strengthened rigidity, resulting in a broken-free and peeling-free nano-pattern formed by the patterned mask 66.

Figure 13:
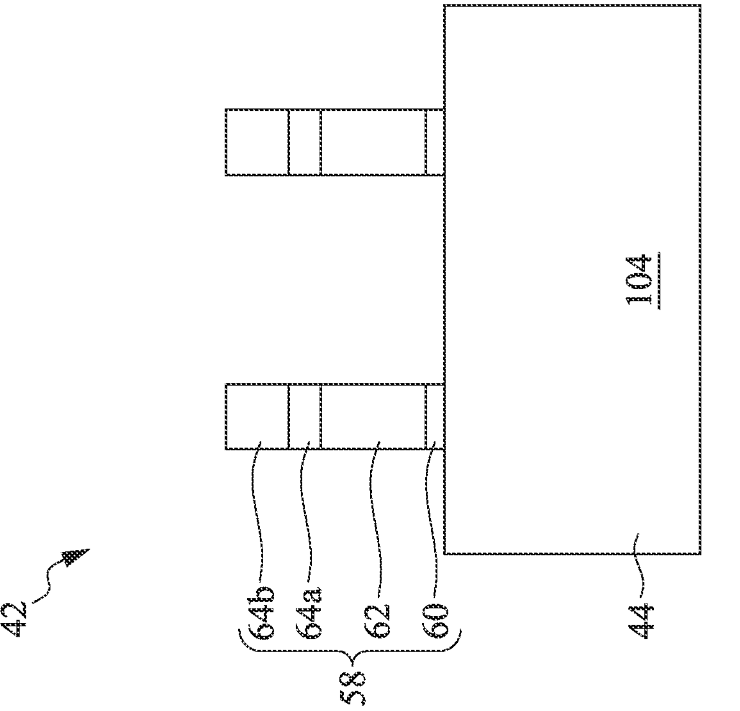

In FIG. 13, using the patterned mask 66 as a mask, the pattern of the patterned mask 66 are extended into the dummy gate stack 58 by etching, using one or more suitable etchants. The patterned mask 66 is at least partially removed during the etching operation in some embodiments. In other embodiments, the patterned mask 66 is removed after etching the dummy gate stack 58 by using a suitable photoresist stripper solvent or by a photoresist ashing operation.

Figure 14:
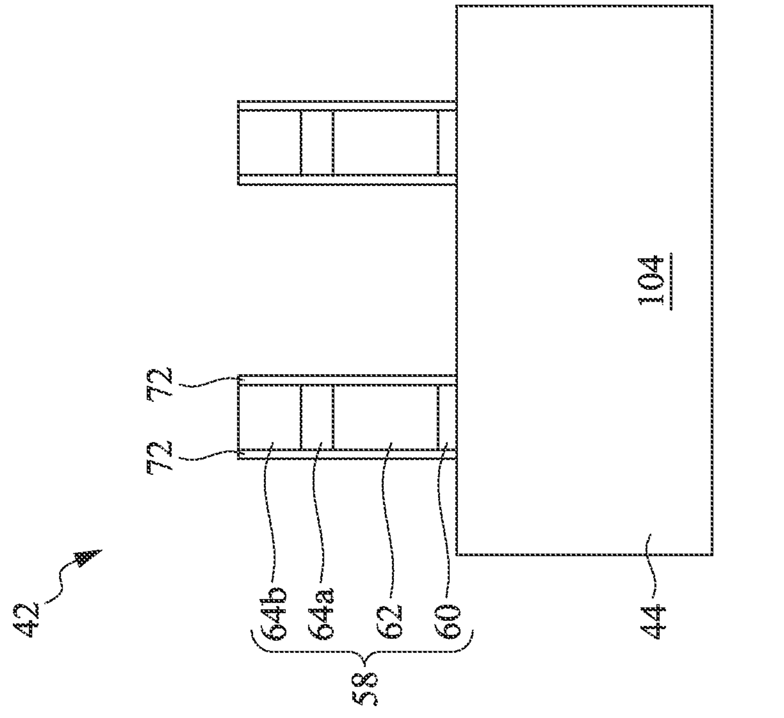
FIGS. 13-16 are diagrammatic fragmentary cross-sectional side views of a semiconductor device at various stages of fabrication in accordance with various aspects of the present disclosure.

Next, as illustrated in FIG. 14, gate spacers 72 are formed on sidewalls of the dummy gate stack 58. In some embodiments of the gate spacer formation step, a spacer material layer is deposited on the substrate 44 and the dummy gate stack 58. The spacer material layer may be a conformal layer that is subsequently etched back to form gate spacers 72. The spacer material layer is made of a low-k dielectric material. The low-k dielectric material has a dielectric constant (k value) of lower than about 3.5. Suitable materials for the low-k dielectric material may include, but are not limited to, doped silicon dioxide, fluorinated silica glass (FSG), carbon-doped silicon dioxide, porous silicon dioxide, porous carbon-doped silicon dioxide, SiLK™ (an organic polymeric dielectric distributed by Dow Chemical of Michigan), Black Diamond (a product of Applied Materials of Santa Clara, Calif.), Xerogel, Aerogel, amorphous fluorinated carbon, Parylene, bis-benxocyclocutenes (BCB), polyimide, polynoroboneses, benzocyclocutene, PTFE, porous SiLK, hydrogen silsesquioxane (HSQ), methylsilsesquioxane (MSQ), and/or combinations thereof. By way of example and not limitation, the spacer material layer may be formed using processes such as, CVD process, a subatmospheric CVD (SACVD) process, a flowable CVD process, an ALD process, a physical vapor deposition (PVD) process, or other suitable process. An anisotropic etching process is then performed on the deposited spacer material layer to expose portions of the fins 104 not covered by the dummy gate stack 58 (e.g., in source/drain regions of the fins 104). Portions of the spacer material layer directly above the dummy gate stack 58 may be completely removed by this anisotropic etching process. Portions of the spacer material layer on sidewalls of the dummy gate stack 58 may remain, forming gate spacers, which are denoted as the gate spacers 72, for the sake of simplicity. In some embodiments, the gate spacers 72 may be used to offset subsequently formed doped regions, such as source/drain regions. The gate spacers 72 may further be used for designing or modifying the source/drain region profile.

Figure 15:
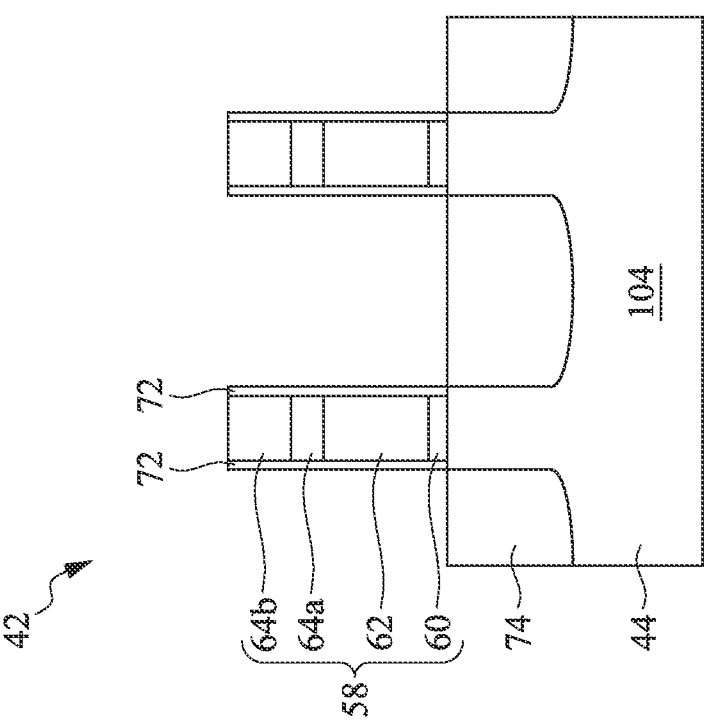

In FIG. 15, after formation of the gate spacers 72 is completed, source/drain epitaxial structures 74 are formed on source/drain regions of the protruding fins 104 that are not covered by the dummy gate stack 58 and the gate spacers 72. In some embodiments, formation of the source/drain epitaxial structures 74 includes recessing source/drain regions of the fins 104, followed by epitaxially growing semiconductor materials in the recessed source/drain regions of the fins 104. The source/drain epitaxial structures 74 are on opposite sides of the dummy gate stack 58.

The source/drain regions of the fins 104 can be recessed using suitable selective etching processing that attacks the fins 104, but hardly attacks the gate spacers 72 and the hard mask layer 64*b* of the dummy gate stack 58. For example, recessing the fins 104 may be performed by a dry chemical etch with a plasma source and an etchant gas. The plasma source may be inductively coupled plasma (ICR) etch, transformer coupled plasma (TCP) etch, electron cyclotron resonance (ECR) etch, reactive ion etch (RIE), or the like and the etchant gas may be fluorine, chlorine, bromine, combinations thereof, or the like, which etches the protruding fins 104 at a faster etch rate than it etches the gate spacers 72 and the hard mask layer 64*b* of the dummy gate stack 58. In some other embodiments, recessing the protruding fins 104 may be performed by a wet chemical etch, such as ammonium peroxide mixture (APM), $NH_4OH$, tetramethylammonium hydroxide (TMAH), combinations thereof, or the like, which etches the fins 104 at a faster etch rate than it etches the gate spacers 72 and the hard mask layer 64*b* of the dummy gate stack 58. In some other embodiments, recessing the protruding fins 104 may be performed by a combination of a dry chemical etch and a wet chemical etch.

Once recesses are created in the source/drain regions of the fins 104, source/drain epitaxial structures 74 are formed in the source/drain recesses in the fins 104 by using one or more epitaxy or epitaxial (epi) processes that provides one or more epitaxial materials on the protruding fins 104. During the epitaxial growth process, the gate spacers 72 limit the one or more epitaxial materials to source/drain regions in the fins 104. In some embodiments, the lattice constants of the source/drain epitaxial structures 74 are different from the lattice constant of the fins 104, so that the channel region in the fins 104 and between the source/drain epitaxial structures 74 can be strained or stressed by the source/drain epitaxial structures 74 to improve carrier mobility of the semiconductor device and enhance the device performance. The epitaxy processes include CVD deposition techniques (e.g., PECVD, vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the fins 104.

In some embodiments, the source/drain epitaxial structures 74 may include Ge, Si, GaAs, AlGaAs, SiGe, GaAsP, SiP, or other suitable material. The source/drain epitaxial structures 74 may be in-situ doped during the epitaxial process by introducing doping species including: p-type dopants, such as boron or $BF_2$; n-type dopants, such as phosphorus or arsenic; and/or other suitable dopants including combinations thereof. If the source/drain epitaxial structures 74 are not in-situ doped, an implantation process (i.e., a junction implant process) is performed to dope the source/drain epitaxial structures 74. In some exemplary embodiments, the source/drain epitaxial structures 74 in an n-type transistor include SiP, while those in a p-type include GeSnB and/or SiGeSnB. In embodiments with different device types, a mask, such as a photoresist, may be formed over n-type device regions, while exposing p-type device regions, and p-type epitaxial structures may be formed on the exposed fins 104 in the p-type device regions. The mask may then be removed. Subsequently, a mask, such as a photoresist, may be formed over the p-type device region while exposing the n-type device regions, and n-type epitaxial structures may be formed on the exposed fins 104 in the n-type device region. The mask may then be removed.

Once the source/drain epitaxial structures 74 are formed, an annealing process can be performed to activate the p-type dopants or n-type dopants in the source/drain epitaxial structures 74. The annealing process may be, for example, a rapid thermal anneal (RTA), a laser anneal, a millisecond thermal annealing (MSA) process or the like.

Figure 16:
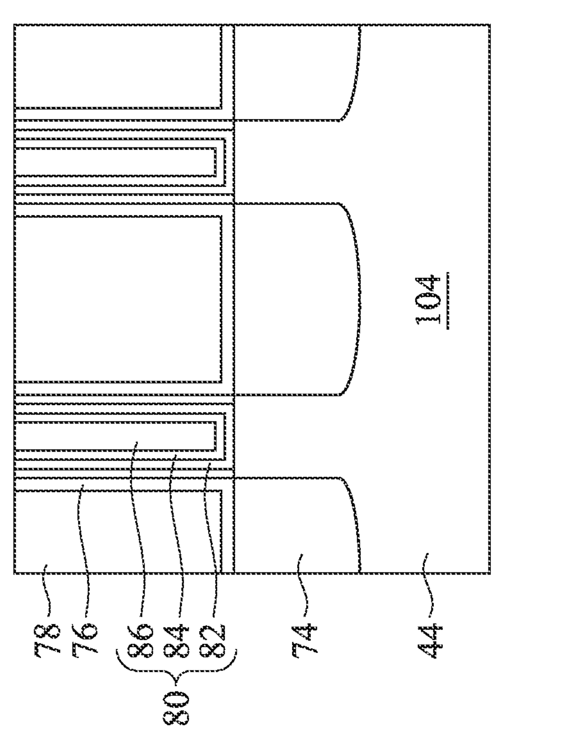

Next, in FIG. 16, a contact etch stop layer (CESL) 76 and an interlayer dielectric (ILD) layer 78 are formed on the substrate 44 in sequence. In some examples, the CESL 76 includes a silicon nitride layer, silicon oxide layer, a silicon oxynitride layer, and/or other suitable materials having a different etch selectivity than the ILD layer 78. The CESL 76 may be formed by plasma-enhanced chemical vapor deposition (PECVD) process and/or other suitable deposition or oxidation processes. In some embodiments, the ILD layer 78 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials having a different etch selectivity than the CESL 76. The ILD layer 78 may be deposited by a PECVD process or other suitable deposition technique. In some embodiments, after formation of the ILD layer 78, the wafer may be subject to a high thermal budget process to anneal the ILD layer 78.

In some examples, after forming the ILD layer 78, a planarization process may be performed to remove excessive materials of the ILD layer 78 and the CESL 76. For example, a planarization process includes a chemical mechanical planarization (CMP) process which removes portions of the ILD layer 78 and the CESL 76 overlying the dummy gate stack 58. In some embodiments, the CMP process also removes hard mask layers 64*a* and 64*b* (as shown in FIG. 15) and exposes the dummy gate electrode 62.

An etching process is performed to remove the dummy gate electrode 62 and the dummy gate dielectric 60, resulting in gate trenches between corresponding gate spacers 72. The dummy gate stack 58 are removed using a selective etching process (e.g., selective dry etching, selective wet etching, or a combination thereof) that etches materials in the dummy gate stack 58 at a faster etch rate than it etches other materials (e.g., gate spacers 72 and/or the ILD layer 78).

Thereafter, replacement gate structures 80 are respectively formed in the gate trenches. The gate structures 80 may be the final gates of FinFETs. In FinFETs, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. The final gate structures each may be a high-k/metal gate (HKMG) stack, however other compositions are possible. In some embodiments, each of the gate structures 80 forms the gate associated with the three-sides of the channel region provided by the fin 104. Stated another way, each of the gate structures 80 wraps around the fin 104 on three sides. In various embodiments, the high-k/metal gate structure 80 includes a gate dielectric layer 82 lining the gate trench, a work function metal layer 84 formed over the gate dielectric layer 82, and a fill metal 86 formed over the work function metal layer 84 and filling a remainder of gate trenches. The gate dielectric layer 82 includes an interfacial layer (e.g., silicon oxide layer) and a high-k gate dielectric layer over the interfacial layer. High-k gate dielectrics, as used and described herein, include dielectric materials having a high dielectric constant, for example, greater than that of thermal silicon oxide (~3.9). The work function metal layer 84 and/or the fill metal 86 used within high-k/metal gate structures 80 may include a metal, metal alloy, or metal silicide. Formation of the high-k/metal gate structures 80 may include multiple deposition processes to form various gate materials, one or more liner layers, and one or more CMP processes to remove excessive gate materials.

In some embodiments, the interfacial layer of the gate dielectric layer 82 may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. The high-k dielectric layer of the gate dielectric layer 82 may include hafnium oxide ($HfO_2$). Alternatively, the gate dielectric layer 82 may include other high-k dielectrics, such as hafnium silicon oxide (HfSiO), hafnium silicon oxynitride (HfSiON), hafnium tantalum oxide (HMO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof.

The work function metal layer 84 may include work function metals to provide a suitable work function for the high-k/metal gate structures 80. For an n-type FinFET, the work function metal layer 84 may include one or more n-type work function metals (N-metal). The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. On the other hand, for a p-type FinFET, the work function metal layer 84 may include one or more p-type work function metals (P-metal). The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials.

In some embodiments, the fill metal 86 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

In some embodiments, the semiconductor device 42 includes other layers or features not specifically illustrated. In some embodiments, back end of line (BEOL) processes are performed on the semiconductor device 42. In some embodiments, the semiconductor device 42 is formed by a non-replacement metal gate process or a gate-first process.

Based on the above discussions, it can be seen that the present disclosure offers advantages over conventional methods. It is understood, however, that other embodiments may offer additional advantages, and not all advantages are necessarily disclosed herein, and that no particular advantage is required for all embodiments. One advantage is that by applying the material in the photoresist segments, the surface roughness of the photoresist segments and the critical dimension (CD) of the trench therebetween can be reduced, resulting in good line width roughness (LWR) and low exposure dose. Another advantage is that the EUV yield can thus be enhanced. Yet another advantage is that the rigidity of the photoresist segments can be strengthened by the material, resulting in broken-free and peeling-free nano-pattern formed by the photoresist segments.

In some embodiments, a method of manufacturing a semiconductor device includes forming a photoresist layer over a substrate, exposing the photoresist layer to an EUV radiation, developing the photoresist layer to form a patterned photoresist, forming a coating layer on the patterned photoresist, and after forming the coating layer on the patterned photoresist, etching the substrate using a combination of the coating layer and the patterned photoresist as an etching mask. In some embodiments, the coating layer covers a surface of the patterned photoresist. In some embodiments, the coating layer fills pores in the patterned photoresist. In some embodiments, the method further includes during or after forming the coating layer on the patterned photoresist, exposing the combination of the coating layer and the patterned photoresist to an extreme ultra violet (EUV) radiation, a deep ultraviolet (DUV) radiation, an ultraviolet (UV) radiation, or a visible light. In some embodiments, the method further includes during or after forming the coating layer on the patterned photoresist, baking the combination of the coating layer and the patterned photoresist. In some embodiments, the method further includes during or after forming the coating layer on the patterned photoresist, performing a liquid treatment on the combination of the coating layer and the patterned photoresist. In some embodiments, forming the coating layer on the patterned photoresist is performed using a solution-coating method, a sol-gel process, a chemical vapor deposition (CVD) process, a physical vapor deposition (PVD) process, or an atomic layer deposition (ALD) process. In some embodiments, the coating layer is in a gaseous state at room temperature. In some embodiments, the coating layer is made of a solution prepared by dissolving a chemical compound in an organic solvent or water.

In some embodiments, a method includes forming a target layer on a substrate, forming a patterned mask over the target layer, wherein the patterned mask is made of a metal-oxide based photoresist including a plurality of pores, and a fill material filling into the plurality of pores of the metal-oxide based photoresist, etching the target layer using the patterned mask as an etch mask, and removing the patterned mask. In some embodiments, the fill material comprises a phosphoric acid group, a phosphonate group, or a combination thereof. In some embodiments, the fill material comprises a phosphoric acid group having a formula of $R—PO_3H_2$, and R is a branched or unbranched, cyclic alkyl, alkene or alkyne substituted with a hydroxyl group, an amine group, an epoxy group, a carboxylic amide group, an ester group, an acid group, a sulfate group, an ether group, or a halogen group, an aromatic ring, or an organometallic complex. In some embodiments, the fill material comprises a phosphonate group having a formula of $R—PO_3R'_2$, and each of R and R' is a branched or unbranched, cyclic alkyl, alkene or alkyne substituted with a hydroxyl group, an amine group, an epoxy group, a carboxylic amide group, an ester group, an acid group, a sulfate group, an ether group, or a halogen group, an aromatic ring, or an organometallic complex. In some embodiments, the fill material comprises a silane having a formula of $R_aSiX_b$, a sum of a and b is equal to 4, R is a branched or unbranched, cyclic alkyl, alkene or alkyne substituted with a hydroxyl group, an amine group, an epoxy group, a carboxylic group, an amide group, an ester group, an acid group, a sulfate group, an ether group, or a halogen group, an aromatic ring, or an organometallic complex, and X is a halogen, an alkoxy group or a fluoroalkoxy group. In some embodiments, the fill material comprises a metal oxide including $R_aSn_bO_cR'_dX_e$, $R_aTi_bO_cR'_dX_e$, $R_aZr_bO_cR'_dX_e$, $R_aHf_bO_cR'_dX_e$, $R_aZn_bO_cR'_dX_e$, $R_aAl_bO_cR'_dX_e$ or $R_aCu_bO_cR'_dX_e$, R is a mono-dentate organic ligand or a multi-dentate organic ligand consisting of a branched, unbranched, or cyclic alkyl, alkene, alkyne, ketone, amide, carboxylic acid, aromatic ring, or a derivative thereof, substituted with a halogen group, R' is an organic ligand consisting of a branched, unbranched, or cyclic alkyl, alkene, alkyne, ketone, amide, carboxylic acid, aromatic ring, or a derivative thereof, substituted with a halogen group or an H atom, X is a halide or a carboxylic anion, and a sum of a, c, d and e equals to a multiplied value obtained by multiplying b and an oxidation number of a metal of the metal oxide.

In some embodiments, a method includes forming a photoresist layer on a substrate, patterning the photoresist layer into a patterned photoresist, forming a photoresist-strengthening material on the patterned photoresist, performing a hardening treatment to harden the photoresist-strengthening material, and after performing the hardening treatment, etching the substrate using a combination of the hardened photoresist-strengthening material and the patterned photoresist as an etching mask. In some embodiments, the hardening treatment comprises exposing the photoresist-strengthening material to an extreme ultra violet (EUV) radiation, a deep ultraviolet (DUV) radiation, an ultraviolet (UV) radiation, or a visible light. In some embodiments, the hardening treatment comprises baking the photoresist-strengthening material formed on the patterned photoresist. In some embodiments, the hardening treatment comprises performing a liquid treatment on the photoresist-strengthening material formed on the patterned photoresist. In some embodiments, the photoresist-strengthening material is an organometallic compound including $R_aSn_bX_c$, $R_aTi_bX_c$, $R_aZr_bX_c$, $R_aHf_bX_c$, $R_aZn_bX_c$, $R_aAl_bX_c$ or $R_aCu_bX_c$, R is a mono-dentate organic ligand or a multi-dentate organic ligand consisting of a branched, unbranched, or cyclic alkyl, alkene, alkyne, ketone, amide, carboxylic acid, aromatic ring, or a derivative thereof, substituted with a halogen group, X is an organic ligand consisting of a branched, unbranched, cyclic alkyl, alkene, alkyne, ketone, amide, carboxylic acid, aromatic ring, or a derivative thereof, substituted with a halogen group, an $NR'_2$, a halide, an SW, or an OR', R' consists of a branched, unbranched, or cyclic alkyl, alkene, alkyne, ketone, amide, carboxylic acid, aromatic ring, or a derivative thereof, substituted with a halogen group or an H atom, and a sum of a and c is equal to a multiplied value obtained by multiplying b and an oxidation number of a metal of the organometallic compound.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:

forming a photoresist layer over a substrate;

exposing the photoresist layer to an EUV radiation;

developing the photoresist layer to form a patterned photoresist;

forming a coating layer on the patterned photoresist and being in direct contact with the patterned photoresist, wherein the coating layer comprises a plurality of separated portions embedded in the patterned photoresist, the separated portions consist essentially of one or more metal oxides; and after forming the coating layer on the patterned photoresist, etching the substrate primarily using a combination of the coating layer and the patterned photoresist as an etching mask.

2. The method of claim 1, wherein the coating layer covers a surface of the patterned photoresist.

3. The method of claim 1, wherein the coating layer fills pores in the patterned photoresist.

4. The method of claim 1, further comprising:

during or after forming the coating layer on the patterned photoresist, exposing the combination of the coating layer and the patterned photoresist to an extreme ultra violet (EUV) radiation, a deep ultraviolet (DUV) radiation, an ultraviolet (UV) radiation, or a visible light.

5. The method of claim 1, further comprising:

during or after forming the coating layer on the patterned photoresist, baking the combination of the coating layer and the patterned photoresist.

6. The method of claim 1, further comprising:

during or after forming the coating layer on the patterned photoresist, performing a liquid treatment on the combination of the coating layer and the patterned photoresist.

7. The method of claim 1, wherein forming the coating layer on the patterned photoresist is performed using a solution-coating method, a sol-gel process, a chemical vapor deposition (CVD) process, a physical vapor deposition (PVD) process, or an atomic layer deposition (ALD) process.

8. The method of claim 1, wherein the coating layer is in a gaseous state at room temperature.

9. The method of claim 1, wherein the coating layer is made of a solution prepared by dissolving a chemical compound in an organic solvent or water.

10. The method of claim 1, wherein at least one of the separated portions comprise a wavy profile when viewed from a cross-sectional view.

11. The method of claim 1, wherein forming the photoresist layer over the substrate comprises forming the photoresist layer comprises a wavy profile when viewed from a cross-sectional view.

12. A method, comprising:

forming a target layer on a substrate;

forming a patterned mask over the target layer, wherein the patterned mask is made of:

a metal-oxide based photoresist including a plurality of pores; and a fill material filling into the plurality of pores of the metal-oxide based photoresist and being in direct contact with the metal-oxide based photoresist, wherein the fill material comprises separated portions inside the metal-oxide based photoresist, the separated portions consist essentially of one or more metal oxides;

etching the target layer primarily using the patterned mask as an etch mask; and removing the patterned mask.

13. The method of claim 12, wherein the fill material comprises the metal oxides including $R_aSn_bO_cR'_dX_e$, $R_aTi_bO_cR'_dX_e$, $R_aZr_bO_cR'_dX_e$, $R_aHf_bO_cR'_dX_e$, $R_aZn_bO_cR'_dX_e$, $R_aAl_bO_cR'_dX_e$ or $R_aCu_bO_cR'_dX_e$, R is a mono-dentate organic ligand or a multi-dentate organic ligand consisting of a branched, unbranched, or cyclic alkyl, alkene, alkyne, ketone, amide, carboxylic acid, aromatic ring, or a derivative thereof, substituted with a halogen group, R' is an organic ligand consisting of a branched, unbranched, or cyclic alkyl, alkene, alkyne, ketone, amide, carboxylic acid, aromatic ring, or a derivative thereof, substituted with a halogen group or an H atom, X is a halide or a carboxylic anion, and a sum of a, c, d and e equals to a multiplied value obtained by multiplying b and an oxidation number of a metal of the metal oxides.

14. The method of claim 12, wherein the fill material has molecules having a size smaller than each of the pores of the plurality of pores of the metal-oxide based photoresist.

15. The method of claim 12, wherein the separated portions include a multilayer structure.

16. A method, comprising:

forming a photoresist layer on a substrate;

patterning the photoresist layer into a patterned photoresist;

forming a photoresist-strengthening material on the patterned photoresist and being in direct contact with the patterned photoresist, wherein the photoresist-strengthening material comprises separated portions inside the photoresist layer, the separated portions consist essentially of one or more organometallic compounds;

performing a hardening treatment to harden the photoresist-strengthening material; and after performing the hardening treatment, etching the substrate primarily using a combination of the hardened photoresist-strengthening material and the patterned photoresist as an etching mask.

17. The method of claim 16, wherein the hardening treatment comprises baking the photoresist-strengthening material formed on the patterned photoresist.

18. The method of claim 16, wherein the hardening treatment comprises performing a liquid treatment on the photoresist-strengthening material formed on the patterned photoresist.

19. The method of claim 16, wherein the photoresist-strengthening material is the organometallic compounds including $R_aSn_bX_c$, $R_aTi_bX_c$, $R_aZr_bX_c$, $R_aHf_bX_c$, $R_aZn_bX_c$, $R_aAl_bX_c$ or $R_aCu_bX_c$, R is a mono-dentate organic ligand or a multi-dentate organic ligand consisting of a branched, unbranched, or cyclic alkyl, alkene, alkyne, ketone, amide, carboxylic acid, aromatic ring, or a derivative thereof, substituted with a halogen group, X is an organic ligand consisting of a branched, unbranched, cyclic alkyl, alkene, alkyne, ketone, amide, carboxylic acid, aromatic ring, or a derivative thereof, substituted with a halogen group, an $NR'_2$, a halide, an SW, or an OR', R' consists of a branched, unbranched, or cyclic alkyl, alkene, alkyne, ketone, amide, carboxylic acid, aromatic ring, or a derivative thereof, substituted with a halogen group or an H atom, and a sum of a and c is equal to a multiplied value obtained by multiplying b and an oxidation number of a metal of the organometallic compounds.

20. The method of claim 16, wherein the substrate comprises a semiconductor wafer, and forming the photoresist layer on the substrate comprises forming the photoresist layer in direct contact with the semiconductor wafer.

* * * * *